United States Patent
Itakura et al.

(10) Patent No.: US 7,071,709 B2
(45) Date of Patent: Jul. 4, 2006

(54) CIRCUIT FOR DETECTING CAPACITANCE CHANGE IN VARIABLE CAPACITANCE

(75) Inventors: Toshikazu Itakura, Toyota (JP); Hisanori Yokura, Chiryu (JP)

(73) Assignee: Denso Corporation, Kariya (JP)

( * ) Notice: Subject to any disclaimer, the term of this patent is extended or adjusted under 35 U.S.C. 154(b) by 106 days.

(21) Appl. No.: 10/940,014

(22) Filed: Sep. 14, 2004

(65) Prior Publication Data

US 2005/0099251 A1 May 12, 2005

(30) Foreign Application Priority Data

Nov. 7, 2003 (JP) ............................... 2003-377989

(51) Int. Cl.
*G01R 27/26* (2006.01)
*G01P 15/125* (2006.01)

(52) U.S. Cl. .................... 324/662; 324/678; 73/514.01
(58) Field of Classification Search ................ 324/662, 324/678, 679, 661
See application file for complete search history.

(56) References Cited

U.S. PATENT DOCUMENTS

| | | | | |
|---|---|---|---|---|
| 5,424,650 A | * | 6/1995 | Frick | 324/688 |
| 5,612,494 A | * | 3/1997 | Shibano | 73/514.32 |
| 5,633,594 A | | 5/1997 | Okada | 324/678 |
| 5,751,154 A | * | 5/1998 | Tsugai | 324/661 |
| 6,529,015 B1 | | 3/2003 | Nonoyama et al. | 324/679 |
| 6,694,814 B1 | * | 2/2004 | Ishio | 73/514.32 |
| 6,797,932 B1 | * | 9/2004 | Takahashi et al. | 250/208.1 |

* cited by examiner

*Primary Examiner*—Anjan Deb
(74) *Attorney, Agent, or Firm*—Posz Law Group, PLC

(57) ABSTRACT

A capacitance of a capacitor member, which varies according to a dynamic force such as an acceleration force imposed on the capacitor member, is detected by a detecting circuit. The detecting circuit is composed of an operational amplifier and a switched capacitor circuit connected in parallel to each other. A reset time (t), during which a feedback capacitor in the switched capacitor circuit is discharged, is set to satisfy the following formula: $t>(\Delta C+m)/n$, where $\Delta C$ is an initial capacitance of the capacitor member, and n and m are constant factors having values in certain ranges. By setting the reset time (t) according to the above formula, an amount of acceleration imposed on the capacitor member is accurately detected even when the capacitor member has a certain level of the initial capacitance.

6 Claims, 6 Drawing Sheets

CIRCUIT FOR DETECTING CAPACITANCE CHANGE IN VARIABLE CAPACITANCE

CROSS-REFERENCE TO RELATED APPLICATION

This application is based upon and claims benefit of priority of Japanese Patent Application No. 2003-377989 filed on Nov. 7, 2003, the content of which is incorporated herein by reference.

BACKGROUND OF THE INVENTION

1. Field of the Invention

The present invention relates to a circuit for detecting a capacitance change in a variable capacitor, the capacitance of which changes according to a physical amount applied thereto, and more particularly to a circuit for detecting an amount of acceleration based on a capacitance change.

2. Description of Related Art

A device for detecting a physical amount such as acceleration or pressure based on capacitance changes in a capacitor is known hitherto. For example, JP-A-8-145717 discloses a circuit for detecting a capacitance difference between a sensor capacitor having a variable capacitance and a reference capacitor having a fixed capacitance. The detecting circuit includes a switched capacitor circuit composed of an operational amplifier, a feedback capacitor and a switching element. In this detector, however, it is difficult to set an initial capacitance difference between the sensor capacitor and the reference capacitor to zero. If the initial capacitance difference exceeds a capacitance of the feedback capacitor in the switched capacitor circuit, the feedback capacitor is saturated and the output of the operational amplifier becomes constant, making the detector circuit inoperable.

JP-A-2001-249028 proposes a detecting circuit having an additional circuit for removing the adverse effects of the initial capacitance (or an offset capacitance). The output of the switched capacitor circuit is converted into stored electric charges in the additional circuit. The capacitance changes in the variable capacitor are detected based on a voltage converted from the stored charges. In this manner, the adverse effects of the offset capacitance are removed. However, it is necessary to provide the additional circuit in this detector, and accordingly the detector becomes complex and expensive.

SUMMARY OF THE INVENTION

The present invention has been made in view of the above-mentioned problem, and an object of the present invention is to provide an improved circuit for detecting capacitance changes in a variable capacitor, the detecting circuit being able to accurately detect the capacitance changes in spite of presence of the initial capacitance or the offset capacitance without using an additional circuit.

Capacitance changes in a capacitor member having a pair of capacitors C1, C2, capacitances of which vary inversely from each other according to an physical amount such as acceleration applied thereto, are detected by a detecting circuit. The detecting circuit is composed of an operational amplifier and a switched capacitor circuit connected in parallel to the operational amplifier. The switched capacitor circuit is composed of a feedback capacitor and a switch connected in parallel to each other. The capacitor member is connected to an inversion input terminal of the operational amplifier so that a signal corresponding to a capacitor difference (C1–C2) is fed to the operational amplifier. A constant reference voltage is supplied to a non-inversion input terminal of the operational amplifier. A voltage representing the amount of acceleration imposed on the capacitor member is outputted from an output terminal of the operational amplifier.

It is preferable that there is no initial capacitance ΔC [=(C1–C2)] when no acceleration is applied to the capacitor member. However, it is unavoidable that there is a certain initial capacitance ΔC. If the initial capacitance is large, charges stored in a feedback capacitor in the switched capacitor circuit are not completely discharged during a reset time in which the switch is closed. The charges are gradually accumulated in the feedback capacitor, and the feedback capacitor becomes saturated and the detecting circuit becomes inoperable. If it is possible to sufficiently prolong the reset time (t), it would be possible to avoid such a saturation in the feedback capacitor. However, there is a certain limitation in prolonging the reset time because a cycle time of detection depends on the reset time.

According to the present invention, the reset time (t) is determined, depending on the amount of initial capacitance ΔC, according to a formula: t>(ΔC+m)/n, where m is a first factor in a range from 0.235–1150000 and n is a second factor in a range from 0.360–1410000. By operating the detecting circuit in the manner to satisfy the above formula, the detecting circuit can accurately detect the amount of acceleration imposed on the capacitor member even when the capacitor member has a certain initial capacitance.

One of the capacitors constituting the capacitor member may be a reference capacitor having a fixed capacitance, and the other capacitor may be a capacitor having a variable capacitance. The capacitor member may be constituted by a single capacitor having a capacitance which varies according to acceleration imposed thereon. The detecting circuit may be integrated into one chip together with the capacitor member to thereby reduce an impedance of a wire connecting the capacitor member to the detecting circuit.

Other objects and features of the present invention will become more readily apparent from a better understanding of the preferred embodiment described below with reference to the following drawings.

DETAILED DESCRIPTION OF THE PREFERRED EMBODIMENT

A preferred embodiment of the present invention will be described with reference to FIGS. 1–6. A sensor chip 12 having first and second capacitors C1 and C2 is electrically connected to a chip forming a detecting circuit 13 through a lead wire 15. A control circuit 14 supplies control signals S1, S2 and S3 to the sensor chip 12 and the detecting circuit 13. In the sensor chip 12, the first capacitor C1 and the second capacitor C2 are connected in series, and electrodes in both capacitors C1, C2 connected to each other are formed as a common electrode. When the common electrode moves in one direction, the capacitance of the capacitor C1 increases while the capacitance of the capacitor C2 decreases, or vice versa. C1, C2 denoting the capacitors will be commonly used to represent respective amount of capacitances.

Figure 1:
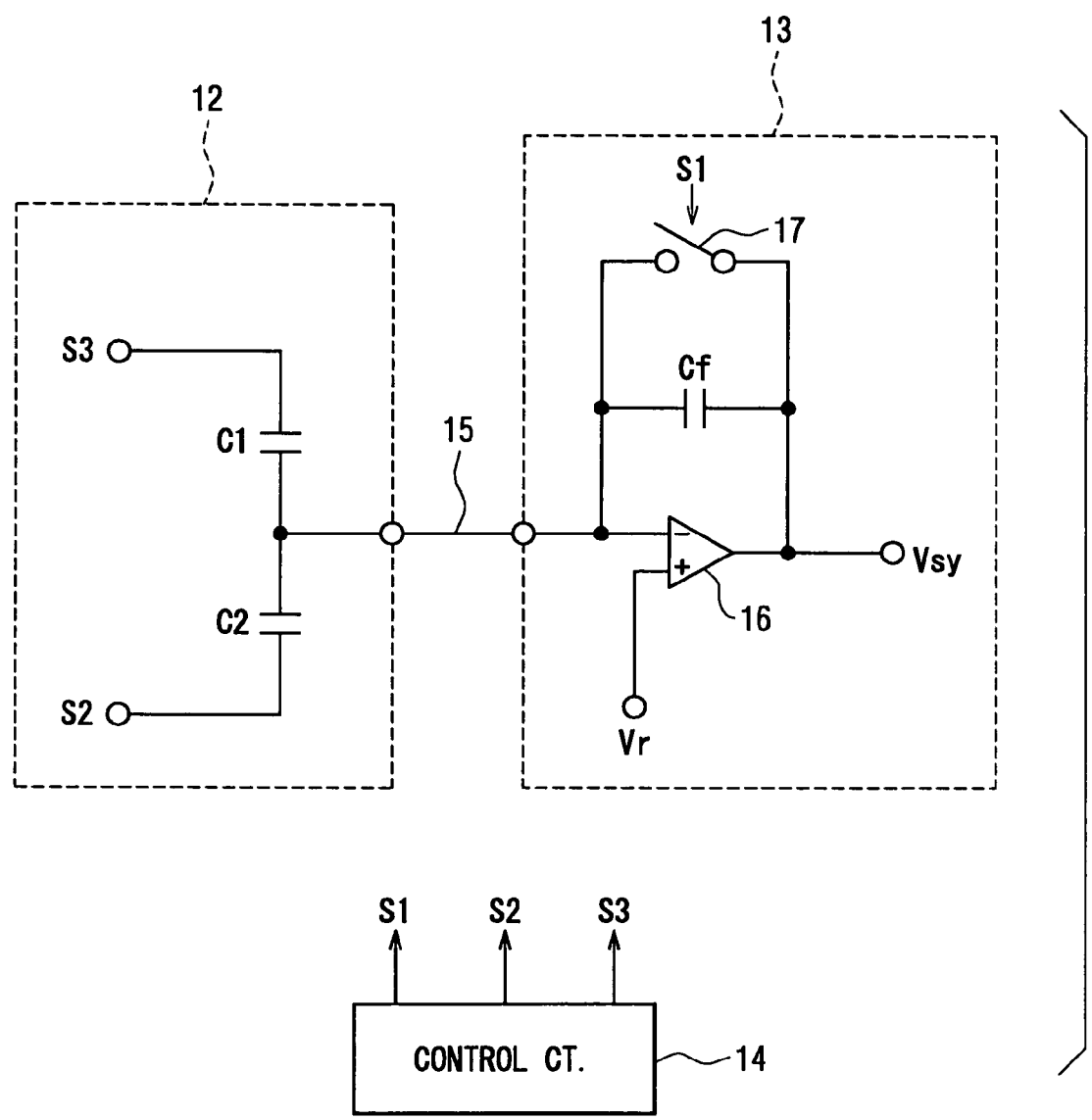
FIG. 1 is a circuit diagram showing a circuit for detecting a capacitance difference between C1 and C1 according to the present invention.

The sensor chip 12 shown in FIG. 1 forms a variable capacitor (also referred to as a capacitor member), the capacitance of which varies in accordance with a physical amount applied thereto, such as acceleration or pressure. In this particular embodiment, the variable capacitor is used as a sensor for sensing acceleration applied thereto. Both capacitors C1, C2 are designed to have the same initial capacitance, and when an acceleration force is applied to the capacitors C1, C2, a capacitance difference between two capacitors appears between C1 and C2. A control signal S3 in a rectangular waveform is supplied to the capacitor C1 from the control circuit 14. A control signal S2 in the same rectangular waveform as the control signal S3 but having an inversed phase is supplied to the capacitor C2. The capacitance difference proportional to an amount of acceleration is fed to the detecting circuit 13 that converts the capacitance difference into a signal voltage.

The detecting circuit 13 formed in one chip is a capacitor-voltage conversion circuit (C-V conversion circuit) including a switched capacitor circuit and an operational amplifier 16. The switched capacitor circuit includes a switch 17 and a feedback capacitor Cf. The switch 17 and the feedback capacitor Cf are connected in parallel to each other, and the parallel circuit is connected between an inversion input terminal and an output terminal of the operational amplifier 16. A signal representing the capacitance difference between C1 and C2 is fed to the inversion input terminal of the operational amplifier 16, and a reference voltage Vr (e.g., 2.5 volts) is supplied to a non-conversion input terminal of the operational amplifier 16.

The switch 17 is formed by, e.g., a bipolar transistor, a field-effect transistor (FET) or the like. Switching operation of the switch 17 is controlled by the control signal S1 fed from the control circuit 14. The changes in the capacitance difference (C1−C2) are converted into an output signal voltage Vsy through the detecting circuit 13.

Figure 2:
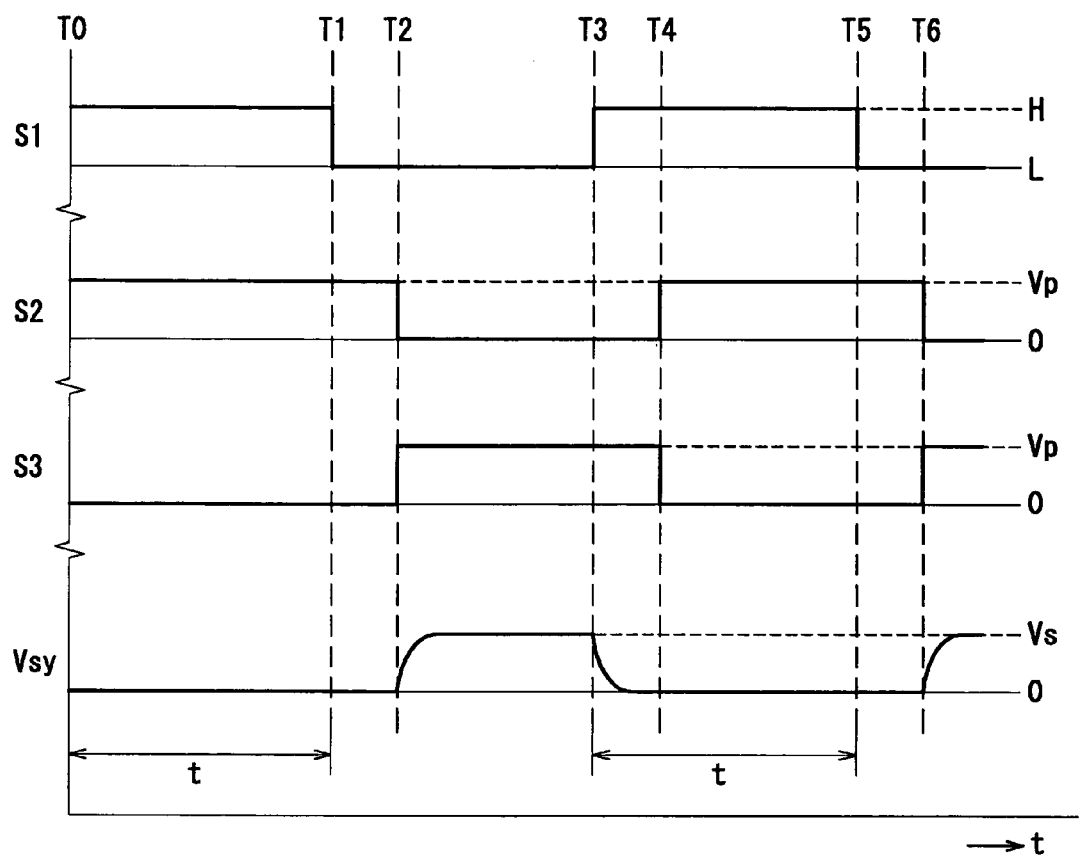
FIG. 2 is a graph showing various waveforms in the detecting circuit shown in FIG. 1.

In FIG. 2, waveforms of the control signals S1, S2, S3 and a waveform of the output signal voltage Vsy are shown. Operation of the switched capacitor 13 will be described with reference to FIG. 2. The capacitances of the capacitors C1, C2 and Cf are expressed as C1, C2 and Cf, respectively in the following formulae. The control signal S1 is a rectangular signal having a high level H and a low level L. The switch 17 is closed by the high level signal H and opened by the low level signal L. The control signals S2 and S3 are also rectangular signals oscillating between Vp (volt) and 0 (volt). Their phases are 180-degree different from each other.

At time T0, an electrical charge $Q1=C1 \cdot (0-Vr)$ is stored in the capacitor C1, and an electrical charge $Q2=C2 \cdot (Vp-Vr)$ is stored in the capacitor C2. A total charge $Qt=(Q1+Q2)$ is stored in both capacitors C1, C2. At time T1, the switch 17 is opened by the control signal S1, thereby opening (direct-current-wise) the operational amplifier 16 between the input terminals and the output terminal. At time T2, an electrical charge $Q1'=C1 \cdot (Vp-Vr)$ is stored in the capacitor C1, and an electrical charge $Q2'=C2 \cdot (0-Vr)$ is stored in the capacitor C2. A total charge $Qt'=(Q1'+Q2')$ is stored in both capacitors C1, C2. At time T2, the switch 17 is opened and the operational amplifier 16 is opened (direct-current-wise) between the input terminals and the output terminal. Therefore, an electrical charge $Qf=(Qt-Qt')$ is stored in the feedback capacitor Cf at time T2. Accordingly, the output signal voltage Vsy is stabilized at a voltage level Qf/Cf.

At time T3, the switch 17 is closed by the control signal S1, and the operational amplifier 16 is closed (direct-current-wise) between the input terminals and the output terminal, putting it under conditions of a voltage follower. Accordingly, the electrical charge stored in the feedback capacitor Cf is discharged and the inversion input terminal of the operational amplifier 16 becomes at the same voltage level as the reference voltage Vr. Thereafter, at time T4–T6, the same operation is repeated. As a result, the output signal voltage Vsy in a substantially rectangular waveform shown in FIG. 2 is outputted from the C-V converter circuit 13. The amplitude Vs of the output signal voltage Vsy is expressed in the following formula: $Vs=Vp \cdot (C1-C2)/Cf$.

Although it is intended to make the capacitors C1, C2 to have the same capacitance, it is actually difficult to make them to have the same capacitance. Therefore, there is a capacitance difference between capacitors C1 and C2 when no acceleration is applied thereto. In other words, there is an initial capacitance (or an offset capacitance) $\Delta C=(C1-C2)$ in the sensor chip 12. If the initial capacitance $\Delta C$ is large, the charges stored in the feedback capacitor Cf are not fully discharged when the switch 17 is closed, and the charges are gradually accumulated in the feedback capacitor Cf. As a result, it becomes difficult to obtain the output signal voltage Vsy correctly representing the amount of acceleration. If the initial capacitance $\Delta C$ exceeds the feedback capacitance Cf, the feedback capacitor Cf is saturated, and it becomes impossible to detect the amount of acceleration.

Figure 3:
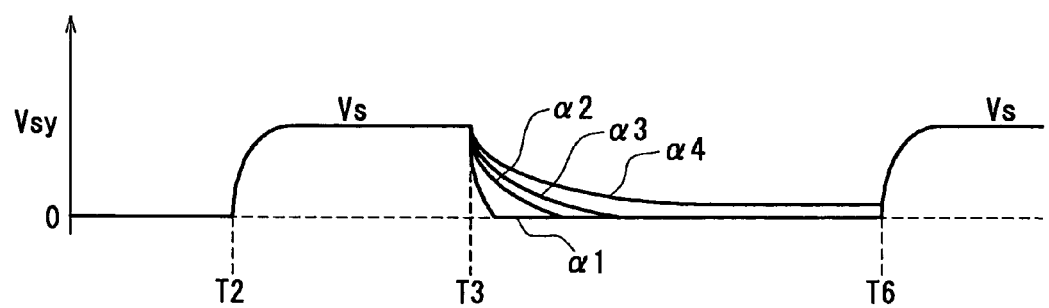
FIG. 3 is a graph showing a waveform of an output signal of the detecting circuit.

The waveform of the output signal voltage Vsy shown in FIG. 2 is shown again in FIG. 3 in an enlarged scale. When the initial capacitance $\Delta C$ is sufficiently small, the output signal voltage Vsy quickly becomes zero by closing the switch 17. In other words, waveform deformation is small as shown by $\alpha 1$. As the initial capacitance $\Delta C$ becomes larger, the waveform deformation becomes larger accordingly as shown by $\alpha 2$, $\alpha 3$ and $\alpha 4$. When the initial capacitance $\Delta C$ becomes further larger, the output signal voltage Vsy never becomes zero, but becomes at a constant level, i.e., saturated.

To avoid the charge accumulation in the feedback capacitor Cf and to thereby avoid the saturation of the output signal voltage Vsy, the period of time in which the switch 17 is closed (referred to as a reset time t) has to be made longer as the initial capacitance $\Delta C$ becomes larger. However, the reset time (t) cannot be made too long because a response time of the detector is prolonged according to the reset time. As to the initial capacitance $\Delta C$, the smaller the better. However, it is difficult to make it smaller than a certain level. So, experiments have been carried out to determine a permissible amount of the initial capacitance $\Delta C$ corresponding to a length of the reset time (t).

The results of the experiments are plotted on a coordinate having the abscissa showing the reset time (t) thereon and the ordinate showing the initial capacitance $\Delta C$ thereon. Points each consisting of the reset time (t) and the initial capacitance $\Delta C$, which realize normal operation of the detecting circuit 13, are shown with diamond marks in FIGS. 4–6. Similarly, those points, which bring the detecting circuit 13 to the saturated situation, are shown with square marks in the same FIGS. 4–6. A straight line separating the points showing normal operation from the points showing the saturation is drawn on the coordinate. The straight line is expressed as follows: $\Delta C=nt-m$, where $\Delta C$ is the initial capacitance (in pF), t is the reset time (in second), n is a first factor determining an inclination of the line, and m is the second factor. This line shows that if the initial capacitance $\Delta C$ is below the line (that is, $\Delta C<nt-m$), the detecting circuit will operate normally. In other words, if the reset time t is at the right side of the line (that is, $t>(\Delta C+m)/n$), normal operation will be realized.

The first factor m is proper if it falls in a range from 0.235 to 1,150,000, and preferably in a range from 0.325 to 0.725, and most preferably in a range from 0.433 to 0.595. The second factor n is proper if it falls in a range from 0.360 to 1,410,000, and preferably in a range from 0.460 to 0.960, and most preferably in a range from 0.610 to 0.810. These ranges are determined in the experiments. If the first factor m is too small, the reset time (t) would be set at a level where the output signal voltage Vsy saturates. If the first factor m is too large, the reset time (t) would be made unnecessarily too long. If the second factor n is too large, a too large initial capacitance $\Delta C$ that causes the saturation of the output signal voltage Vsy would be permitted. If the second factor n is too small, the initial capacitance $\Delta C$ that does not cause the saturation would be prohibited.

Figure 4:
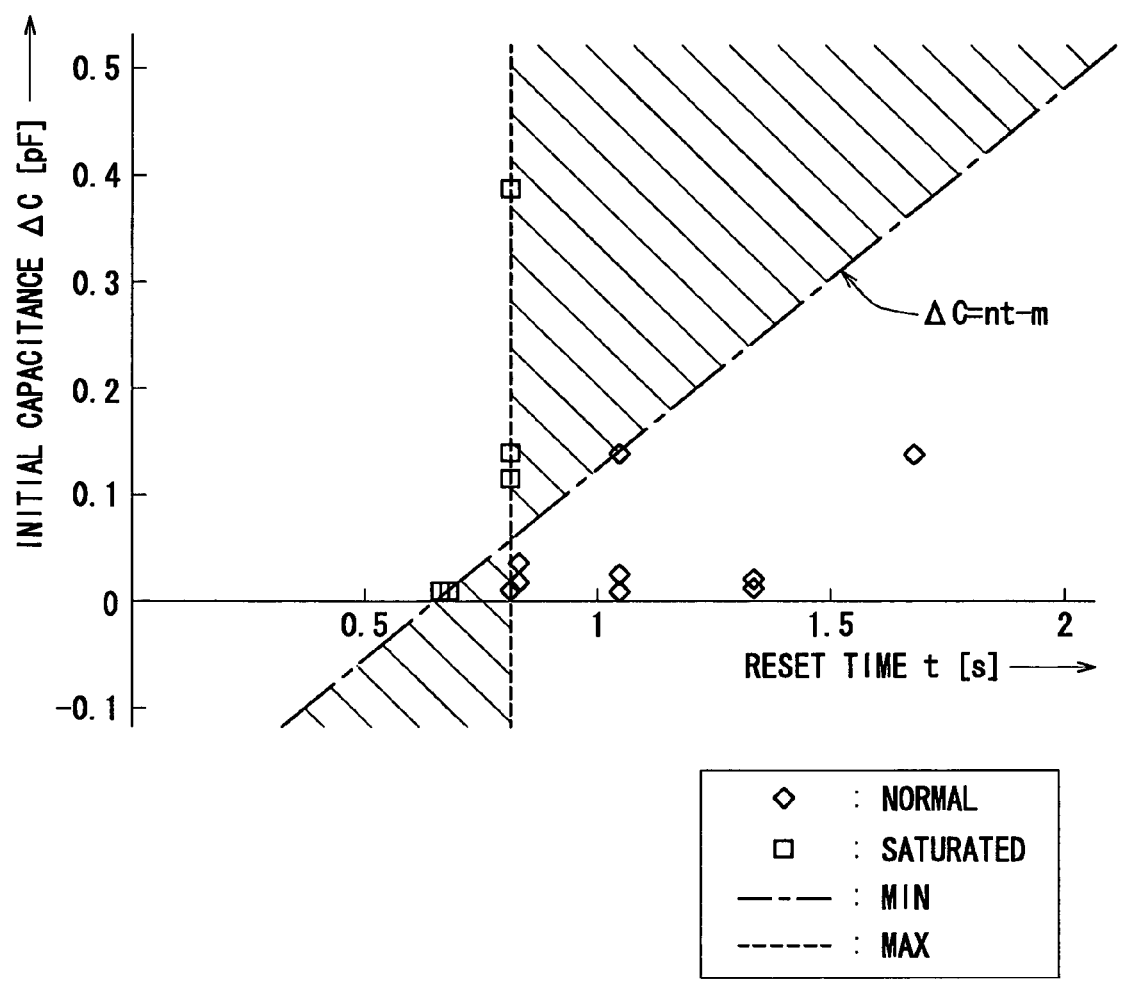
FIG. 4 is a graph showing a line indicating a relation between a reset time (t) and an initial capacitance (ΔC), and a wide region in which the line should be located.
Figure 5:
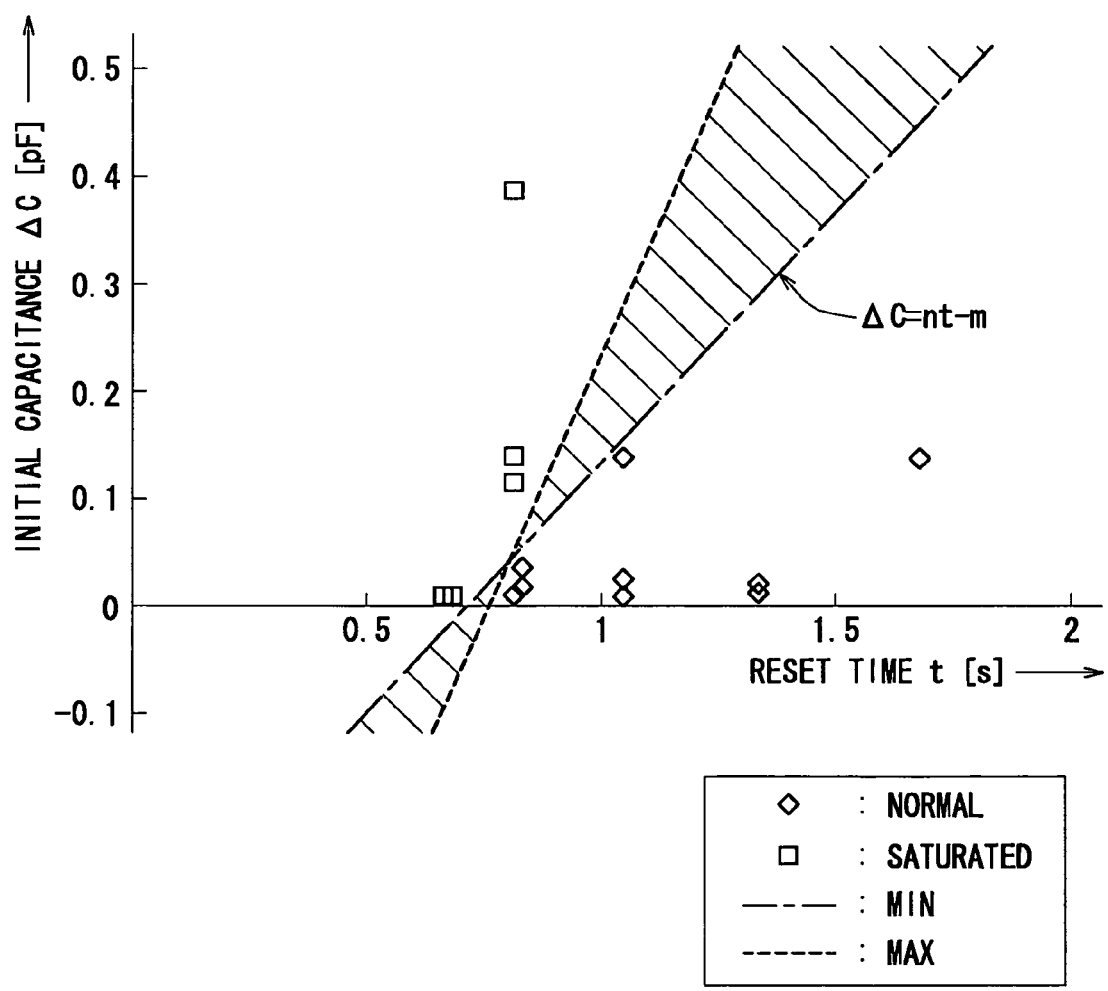
FIG. 5 is a graph showing a line indicating a relation between a reset time (t) and an initial capacitance. (ΔC), and an intermediate region in which the line should be located.
Figure 6:
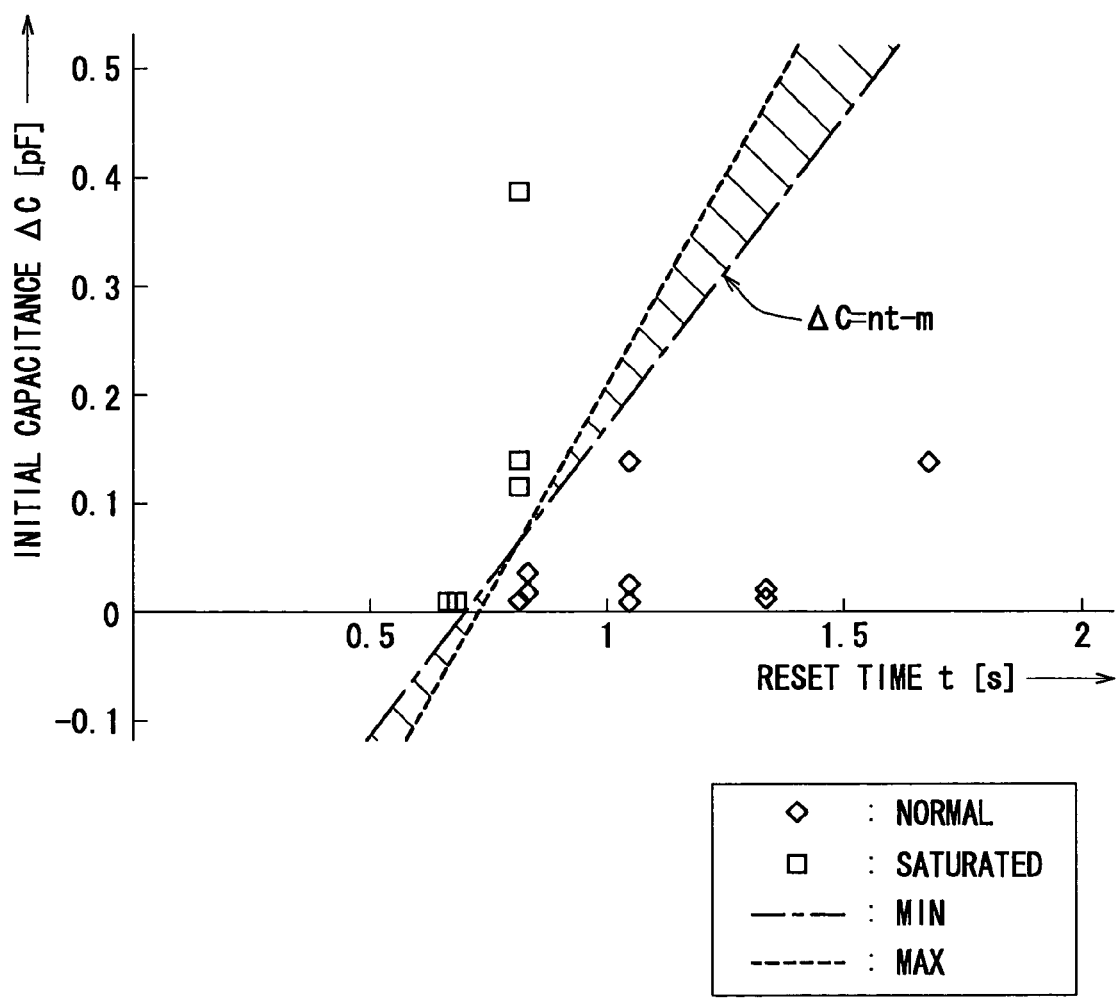
FIG. 6 is a graph showing a line indicating a relation between a reset time (t) and an initial capacitance (ΔC), and a narrow region in which the line should be located.

FIG. 4 shows a situation where the first factor m and the second factor n are in the proper range mentioned above. That is, if the straight line expressed by the formula [$\Delta C=nt-m$] is located in the hatched area in FIG. 4 and if the initial capacitance $\Delta C$ is below the line, the detecting circuit 13 will normally operate. FIG. 5 shows a situation where the first factor m and the second factor n are in the preferable range mentioned above. That is, if the straight line expressed by the formula [$\Delta C=nt-m$] is located in the hatched area in FIG. 5 and if the initial capacitance $\Delta C$ is below the line, the detecting circuit 13 will operate in a preferable manner. FIG. 6 shows a situation where the first factor m and the second factor n are in the most preferable range mentioned above. That is, if the straight line expressed by the formula [$\Delta C=nt-m$] is located in the hatched area in FIG. 6 and if the initial capacitance $\Delta C$ is below the line, the detecting circuit 13 will operate in the most preferable manner.

By setting the reset time (t) and the initial capacitance $\Delta C$ according to the formula of the present invention, the changes in the capacitance difference (C1–C2) due to acceleration force can be properly detected without causing the saturation in the output signal voltage Vsy even if there is a certain initial capacitance (or an offset capacitance) $\Delta C$. Therefore, it is not necessary to provide an additional circuit for removing the adverse effects of the initial capacitance or the offset capacitance.

In the embodiment described above, an electrode that is movable according to acceleration is provided commonly to the capacitors C1, C2 so that the capacitance difference (C1–C2) represents an amount of acceleration applied thereto. However, the capacitors may be differently arranged. A capacitor having an electrode that is movable according to acceleration may be used as the first capacitor C1 (a sensor capacitor), and a capacitor having a fixed capacitance may be used as the second capacitor C2 (a reference capacitor). In this arrangement, too, the capacitance difference (C1–C2) represents the amount of acceleration. It is also possible to eliminate the reference capacitor C2 and to use only the variable capacitor C1, the capacitance of which varies according to an amount of acceleration. In this case, an initial capacitance of C2 which appears when no acceleration is imposed corresponds to the initial capacitance $\Delta C$ of the foregoing embodiment. By properly setting the relation between the reset time (t) and the initial capacitance $\Delta C$, the detecting circuit operates properly.

Figure 7:
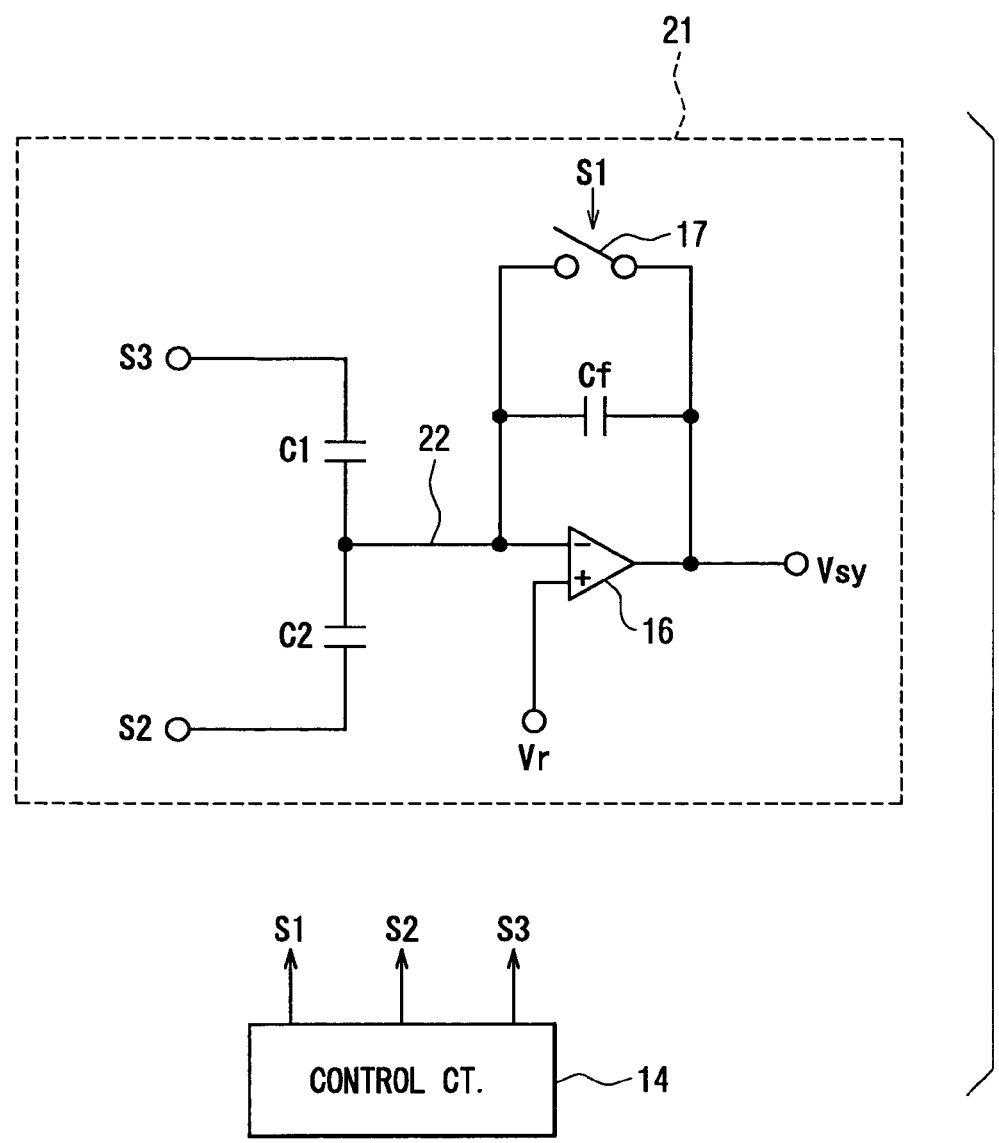
FIG. 7 is a circuit diagram showing the detecting circuit which is integrated in to one chip together with variable capacitors C1 and C2.

The waveform deformation ($\alpha 1-\alpha 4$) shown in FIG. 3 depends not only on the amount of $\Delta C$ but also on an impedance Z of the wire 15 connecting the sensor chip 12 and the detecting circuit chip 13. More particularly, the waveform deformation increases according to an amount of time constant i, which is a product of the impedance Z and the initial capacitance $\Delta C$ ($\tau=Z\cdot\Delta C$). To decrease the time constant i, it is advantageous to integrate the sensor chip 12 and the detecting circuit chip 13 into one chip 21, as shown in FIG. 7. Because the connecting wire 15 is replaced with an inner connector 22 by integrating two chips, the amount of impedance Z is considerably decreased. In this manner, the advantages of the present invention are further enhanced.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A circuit for detecting a capacitance change in a capacitor member, a capacitance of which varies according to a physical amount applied thereto, the detecting circuit comprising:
   an operational amplifier having an inversion input terminal to which the capacitor member is connected; and
   a switched capacitor circuit composed of a feedback capacitor and a switch connected in parallel to each other, the switched capacitor circuit being connected between the inversion input terminal and an output terminal of the operational amplifier, wherein the detecting circuit operates to satisfy the following formula:
   $t>(\Delta C+m)/n$, where t is a reset time during which the switch is closed, $\Delta C$ is an initial capacitance of the capacitor member when no physical amount is applied thereto, m is a first factor having a value in a range from 0.235–1150000, and n is a second factor having a value in a range from 0.360–1410000.

2. The detecting circuit as in claim 1, wherein:
   the capacitor member is composed of a first capacitor and a second capacitor, capacitances of both capacitors inversely changing from each other in response to a physical amount applied thereto; and
   the initial capacitance $\Delta C$ is a capacitance difference between both capacitors when no physical amount is applied to both capacitors.

3. The detecting circuit as in claim 1, wherein:
   the capacitor member is composed of a reference capacitor having a fixed capacitance and a variable capacitor, the capacitance of which varies in accordance with the physical amount applied thereto, the physical amount being detected based on a capacitance difference between the variable capacitor and the reference capacitor; and the initial capacitance ΔC is a capacitance difference between the two capacitors when no physical amount is applied thereto.

4. The detecting circuit as in claim 1, wherein:
the detecting circuit is integrated into one chip together with the capacitor member.

5. The detecting circuit as in claim 1, wherein:
the physical amount is a dynamic force applied to the capacitor member.

6. The detecting circuit as in claim 5, wherein:
the dynamic force is an acceleration force applied to the capacitor member.

* * * * *